United States Patent
Shih et al.

(10) Patent No.: US 7,153,197 B2
(45) Date of Patent: Dec. 26, 2006

(54) METHOD FOR ACHIEVING UNIFORM CU CMP POLISHING

(75) Inventors: Tsu Shih, Hsin-Chu (TW); Sa-Na Lee, Hsinchu (TW); Syun-Ming Jang, Hsin-Chu (TW); Chi-Weng Chung, Douliou (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/140,728

(22) Filed: May 7, 2002

(65) Prior Publication Data

US 2003/0211814 A1    Nov. 13, 2003

(51) Int. Cl.
    *B24B 1/00*    (2006.01)
    *C23G 1/02*    (2006.01)
(52) U.S. Cl. .................. 451/36; 451/41; 451/54; 134/3; 134/902; 156/345.12; 257/E21.304
(58) Field of Classification Search .............. 451/36, 451/28, 41, 54, 59, 60, 63, 37, 57, 66, 67; 156/345.11, 345.12; 134/3, 902; 257/E21.304
See application file for complete search history.

(56) References Cited

U.S. PATENT DOCUMENTS

| | | | |
|---|---|---|---|
| 6,191,040 B1 * | 2/2001 | Glass | 451/36 |
| 6,276,997 B1 * | 8/2001 | Li | 451/41 |
| 6,299,516 B1 * | 10/2001 | Tolles | 451/56 |
| 6,376,335 B1 * | 4/2002 | Zhang et al. | 438/471 |
| 6,435,944 B1 * | 8/2002 | Wang et al. | 451/41 |
| 6,443,814 B1 * | 9/2002 | Miller et al. | 451/41 |
| 6,458,016 B1 * | 10/2002 | Merchant et al. | 451/23 |
| 6,530,824 B1 * | 3/2003 | Thomas et al. | 451/41 |
| 6,579,153 B1 * | 6/2003 | Uchikura et al. | 451/41 |
| 6,582,279 B1 * | 6/2003 | Fox et al. | 451/37 |

* cited by examiner

*Primary Examiner*—Hadi Shakeri
(74) *Attorney, Agent, or Firm*—Tung & Associates

(57) ABSTRACT

A method for removing a metal oxide overlayer over a target polishing surface in conjunction with a chemical mechanical polishing (CMP) process to improve polishing uniformity including providing a substrate target polishing surface having a layer of an oxide of a metal overlying said metal to be chemically mechanically polished; removing the layer of an oxide of the metal using an oxide removal solution prior to performing a CMP process with an abrasive slurry; and, polishing the target polishing surface according to an a CMP process with an abrasive slurry including at least one of an oxidizer and a complexing agent.

20 Claims, 2 Drawing Sheets

METHOD FOR ACHIEVING UNIFORM CU CMP POLISHING

FIELD OF THE INVENTION

This invention generally relates to chemical mechanical polishing (CMP) and more particularly to a method for achieving more uniform copper (Cu) removal in a chemical mechanical polishing (CMP) process.

BACKGROUND OF THE INVENTION

In semiconductor fabrication integrated circuits and semi-conducting devices are formed by sequentially forming features in sequential layers of material in a bottom-up manufacturing method. The manufacturing process utilizes a wide variety of deposition techniques to form the various layered features including various etching techniques such as anisotropic plasma etching to form device feature openings followed by deposition techniques to fill the device features. In order to form reliable devices, close tolerances are required in forming features including photolithographic patterning methods which rely heavily on layer planarization techniques to maintain a proper depth of focus.

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface nonplanarity will undesirably affect the quality of several semiconductor manufacturing process including, for example, in a photolithographic process, the positioning the image plane of the process surface within an increasingly limited depth of focus window to achieve high resolution semiconductor feature patterns.

One planarization process is chemical mechanical polishing (CMP). CMP is increasingly being used as a planarizing process for semiconductor device layers, especially for applications with smaller semiconductor fabrication processes, for example, below about 0.25 micron. CMP planarization is typically used several different times in the manufacture of a multi-layer semiconductor device, including preparing a layered device structure in a multi-layer device for subsequent processing. For example, CMP is used to remove excess metal after filling conductive metal interconnects such as vias and trench lines with metal, for example copper, to electrically interconnect the several layers and areas that make up a multilayer semiconductor device.

In the formation of conductive interconnections, copper is increasingly used for forming metal interconnects such as vias and trench lines since copper has low resistivity. The undesirable contribution to electrical parasitic effects by metal interconnect residual resistivity has become increasingly important as device sizes have decreased.

In a typical process for forming conductive interconnections in a multi-layer semiconductor device, a damascene process is used to form vias and trench lines for interconnecting different layers and areas of the multilayer device. Vias (e.g., V1, V2 etc. lines) are generally used for vertically electrically interconnecting semiconductor device layers and trench lines (e.g., M1, M2, etc. lines) are used for electrically interconnecting semiconductor device areas within a layer. Vias and trench lines are typically formed as part of a damascene process. Although there are several different methods for forming damascene structures, one typical method generally involves patterning and etching a semiconductor feature, for example a via opening within an insulating dielectric layer to make contact with a conductive area within an underlying layer of the multilayer device. The via opening (plug) may then be filled with, for example copper, to form a via (plug) followed by a CMP step to remove excess metal deposited on the insulating dielectric layer surface and to planarized the surface for a subsequent processing step. A second insulating dielectric layer is then deposited followed by patterning and etching the second insulating dielectric layer to form a trench opening situated over the via. The trench opening is then filled with a metal, for example, copper, to form trench lines which electrically communicate with other layers through conductive contact with vias and also electrically communicate with other areas within the layer by trench line metal interconnects. A second CMP step is then carried out similar to the first CMP step to remove excess metal and to planarize the process wafer surface in preparation for further processing.

CMP generally includes placing a process surface of the wafer in contact against a flat polishing surface, imparting a downforce to the wafer backside and moving the wafer and the polishing surface relative to one another. The polishing action is typically aided by a slurry which includes for example, small abrasive particles such as silica ($SiO_2$) or alumina ($Al_2O_3$) that abrasively act to remove a portion of the process surface. Additionally, the slurry may include chemicals (e.g.,complexing agents and film forming agents) that react with the process surface to assist in removing a portion of the surface material, the slurry typically being separately introduced between the wafer surface and the polishing pad. During the polishing or planarization process, the wafer is typically pressed against a rotating polishing pad. In addition, the wafer may rotate and oscillate over the surface of the polishing pad to improve polishing effectiveness.

Typically CMP polishing slurries contain an abrasive material, such as silica or alumina, suspended in an aqueous medium. There are various mechanisms disclosed in the prior art by which metal surfaces can be polished with slurries. In one method, the formation of a thin oxide layer takes place in-situ by reaction between the metal surface and an oxidizing agent which simultaneously forms an oxide layer while an abrasive is removing the oxide layer. The thin abradable oxide layer including the underlying metal layer is thereby selectively removed in a controlled manner by mechanical abrasive action. The rate of material removal can be varied by adjusting the rate of oxide formation and material removal.

Several defects can be associated with CMP polishing. For example,in CMP polishing, metals, for example, copper in a dense array of metal interconnects is removed or eroded at a faster rate than the surrounding field of insulating dielectric. This causes a topography difference between insulating dielectric and the dense copper array, typically referred to as erosion. More highly abrasive materials included in a polishing slurry tend to exacerbate the problem. Another problem, is related to the chemical etching rate of the etchants included in a polishing slurry. A strong acid, for example leads to a higher chemical etching rates which may result in a dimensional difference over a polishing area, referred to as dishing, caused by differences in polishing rates over the polishing area. Another defect related to relatively highly abrasive materials is the phenomenon of peeling of dielectric layers when subjected to polishing induced stresses. The problem is exacerbated where low-k (dielectric constant) layers with copper metal interconnects are present. The generally more porous nature of the low-k layers presents adhesion problems with both copper interconnects and other low-k layers.

In a typical copper CMP process, in order to avoid plastic deformation induced defects (e.g., scratches and divots) into the copper metal surface caused by abrasive slurry particles, and to aid in global planarization (extending over the process wafer surface) by equalizing rates of material removal across the process wafer surface, a slurry including abrasive particles and a copper oxide forming chemical are used to achieve both copper oxide formation over the copper surfaces and a suitably selective planarization (surface material removal) rate over the entire process wafer surface.

For example, a typical copper CMP polishing slurry includes silica ($SiO_2$) or alumina ($Al_2O_3$) abrasive particles, hydrogen peroxide ($H_2O_2$) and various acids or bases to adjust the pH of the slurry. The oxidizing agent, for example, hydrogen peroxide ($H_2O_2$), is used to oxidize the copper surface to form a thin layer of copper oxide which is simultaneously removed by the abrasive polishing process of the abrasive particles thereby creating a fresh copper surface for continued surface reaction between the hydrogen peroxide ($H_2O_2$) and the copper surface. The copper oxide is formed on the copper surface by an in-situ chemical reaction induced over the copper surface. The in-situ generated copper oxide typically includes an hydroxide of copper (e.g., $Cu(OH)_x$) generally referred to herein as copper oxide typically coexisting with more familiar forms of copper oxide (e.g., CuO, $Cu_2O$) formed by other ex-situ oxidation processes.

In another method of polishing copper surfaces, a complexing agent forms a complex by chelating a copper ion which is then removed by a lower hardness abrasive. The advantage of using a lower hardness abrasive is that defects such as dishing, erosion, divot formation, and peeling are minimized. For example, colloidal particles including silica ($SiO_2$) and alumina ($Al_2O_3$) produced by sol-gel process to produce dispersed particles are typically less abrasive than the same material produced by a high temperature fuming process where larger agglomerates of the particles with sharper particle edges and denser material are produced.

Using either method of the prior art to polish copper containing surfaces has associated problems. For example, if an oxidizer is used to form an in-situ copper oxide film over the target polishing surface, a more highly abrasive material is required to remove the copper oxide layer leading to a higher rate of defect formation such as erosion, divot formation, and peeling. On the other hand, if a complexing agent is used for chelating a surface copper ion to form a complex for subsequent removal with a less abrasive material, the effectiveness of the process is inhibited if the more polishing resistant copper oxide is present on the surface. Copper oxides (e.g., CuO, $Cu_2O$) are typically formed on copper surfaces by ex-situ oxidation processes including exposure to oxygen containing ambient. The ex-situ formed copper oxides (e.g., CuO, $Cu_2O$) are more dense and more resistant to material removal compared to copper or in-situ formed copper oxide (hydroxide) e.g., $Cu(OH)_x$. As a result, non-uniform copper oxide films present on the target polishing surface propagate non-uniformities in subsequent polishing processes. Non-uniformities in the polished surface, in turn, lead to variations in metal interconnect resistivities including residual copper left on the polishing surface.

For example, FIGS. 1A–1C are conceptual side view representations of a portion of a semiconductor wafer surface showing copper oxide formation and removal according to the prior art. In FIG. 1A is shown a layer of copper 14 overlying insulating dielectric layer 12, copper layer 14 showing an ideal representation of a newly formed copper surface 14A.

FIG. 1B shows the formation of copper oxide layer 16 over the copper surface 14A during a standard CMP process whereby an oxidizing chemical such as hydrogen peroxide oxidizes the copper surface to form an in-situ generated passivation film of copper oxide (e.g., $Cu(OH)_x$).

FIG. 1C shows the undesirable consequence of the method according to the prior art where a low spot including the copper oxide film 16 is removed at a relatively slow rate while removing the copper oxide film 16 at a high spot e.g., 18, and leaving a portion of the copper oxide 16 film at a low spot, e.g., 20.

FIG. 1D shows a dense copper oxide (e.g., CuO, CuO2) film 22 formed on most copper surfaces by ambient oxidation processes (aging) of the copper surface. This copper oxide film typically includes the general formula CuO, $Cu2O$, being more dense compared to the in-situ generated copper oxide film (e.g., $Cu(OH)_x$) produced during the slurry polishing process. As a result, the problem of uniformly removing an in-situ generated copper oxide film (e.g. $Cu(OH)_x$) is exacerbated by the presence of the denser copper oxide film formed by ex-situ oxidation processes. The rate of surface material removal using an abrasive slurry of the prior art including an oxidizing chemical, for example, hydrogen peroxide, is much slower over a copper oxide surface compared to a copper surface.

Therefore, there is a need in the semiconductor art to develop a CMP method for planarizing dielectric layers including copper semiconductor features such that the CMP process results in a more uniform material removal rate with a lower level polishing induced defects.

It is therefore an object of the invention to provide a CMP method for planarizing dielectric layers including copper semiconductor features such that the CMP process results in a more uniform material removal rate with a lower level of polishing induced defects while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for removing an oxide layer prior to polishing metal containing layers in a substrate, for example, a semiconductor wafer prior to or simultaneously with a chemical mechanical polishing (CMP) process to achieve a uniform polishing rate.

In a first embodiment according to the present invention, the method includes providing a substrate surface, for example, a semiconductor wafer surface having a layer of an oxide of a metal overlying a metal to be chemically mechanically polished; removing the layer of an oxide of the metal according to an etching process; cleaning the semiconductor wafer to include the wafer process surface according to a wet cleaning process; and, chemically mechanically polishing the wafer process surface according to a CMP process including applying at least an abrasive slurry to the wafer process surface.

In another embodiment, the layer of an oxide of the metal is at least one of an oxide of copper, aluminum, and copper.

In another related embodiment, the step of removing the layer of an oxide of the metal further includes using a wet chemical etchant wherein the wafer process surface is subjected to at least one of dipping into the wet chemical etchant and spraying the wet chemical etchant onto the wafer process surface while simultaneously agitating the wafer process surface. Further, agitating the wafer process surface includes at least one of megasonic energy and brushing. Further, yet, the wet chemical etchant is an aqueous basic solution with a pH of greater than about 10. Yet further, the wet chemical etchant includes potassium hydroxide (KOH).

In another embodiment, the step of removing the layer of an oxide of the metal further includes plasma etching the layer of an oxide of the metal according to a reactive ion etch process. Further, the reactive ion etch process further includes igniting and maintaining a plasma including at least one of fluorocarbons and hydrofluorocarbons.

In another embodiment, the wet cleaning process includes using deionized water wherein the wafer process surface is subjected to at least one of dipping into the deionized water and spraying the deionized water onto the wafer process surface while simultaneously agitating the wafer process surface.

In other related embodiments, the step of chemically mechanically polishing further includes applying a polishing solution to the wafer process surface for forming an oxide layer in-situ over the metal. Further, the polishing solution includes at least hydrogen peroxide. Further yet, the method includes a wafer process surface cleaning step following the step of chemically mechanically polishing.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
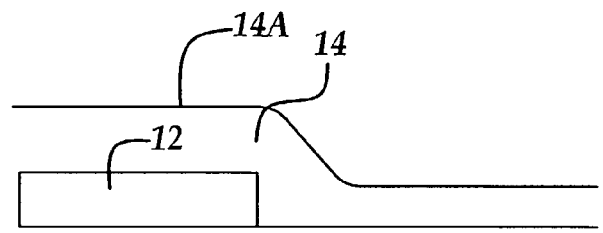
FIGS. 1A to 1D are conceptual schematic representations of an exemplary semiconductor feature with an exemplary metal overlayer including an oxide overlayer showing a chemical mechanical polishing process according to the prior art.
Figure 1B:
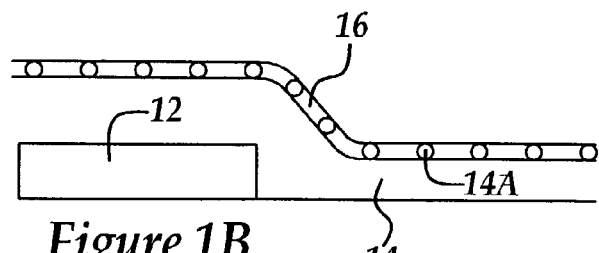
Figure 1C:
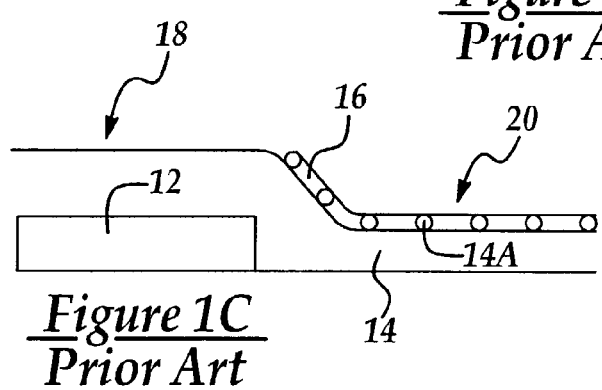
Figure 1D:
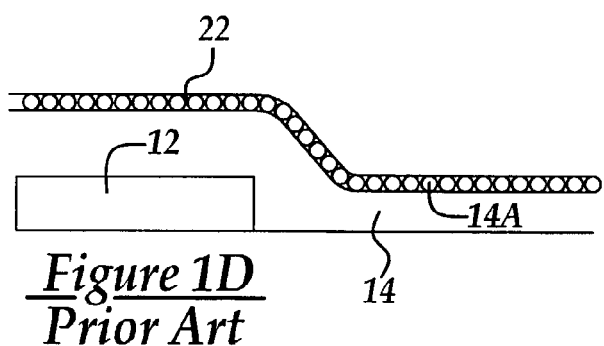

While the method according to the present invention is explained primarily with reference to a CMP process performed on a semiconductor wafer having a layer of copper oxide overlying a copper containing semiconductor wafer surface, it will be appreciated that the method of the present invention may be advantageously used with any polishing process having a metal oxide layer overlying the corresponding metal where the metal oxide overlayer may be advantageously removed in order to optimize a surface material (e.g., metal) removal rate in a CMP process. By use of the term "copper" herein is included copper and its alloys including multi-layer copper containing substrates.

The term "particle" as it is used herein refers to both agglomerates of more than one primary particle and to single primary particles, however the "mean particle diameter" as used herein refers to the mean diameter of the primary particle whether agglomerated with other primary particles or not. By the term "mean particle diameter" is meant a mean diameter taken from a statistically significant sampling of the average equivalent spherical diameter of primary particles when using TEM image analysis.

In one embodiment according to the present invention, a metal oxide layer, for example copper oxide (e.g., CuO, $Cu_2O$) formed by ex-situ ambient oxidation processes over the target polishing surface, for example a semiconductor wafer, is removed from the target polishing surface prior to performing a polishing process including a CMP planarization process.

In one embodiment of the present invention, the overlayer of copper oxide is removed according to a pre-CMP polishing oxide removal process. The pre-CMP polishing oxide removal process includes the use of a weakly acidic complexing agent. It is believed that the weakly acidic complexing agent forms a complex with the copper oxide (e.g., CuO, $Cu_2O$) to aid in material removal of the copper oxide from the target polishing surface. It is believed weak complexes are formed between the copper oxide and carboxylate anions through hydrogen bonding mechanisms under acidic conditions. Suitable oxide removal solutions include carboxylic acids with a pH of between about 3.0 and about 5.0. In order to perform the complexing function according to the present invention, the carboxylic acid preferably includes at least one carboxylate group. Exemplary carboxylic acids include formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, adipic acid, and combinations thereof. Preferably, however, a carboxylic acid such as citric acid, which contains more than one carboxylic acid group is included in the oxide removal solution, as it is believed the complexing function is improved thereby. The complexing agent is preferably present in the oxide removal solution in an amount ranging from about 0.1 to about 10.0 weight percent. Preferably the oxide removal solution according to the present invention is within a temperature range of from about 20° C. to about 90° C.

According one embodiment of the present invention, a substrate, for example a semiconductor process wafer is directly dipped into the oxide removal solution solution. Following the direct dip process, the semiconductor process wafer may be subjected to a brush cleaning process to remove any loosened copper oxide layer particles remaining on the process wafer surface and to clean the process wafer. According to the present invention, preferably the oxide overlayer is contacted with the oxide removal solution for a period of from about 5 to about 90 seconds, more preferably from about 20 to about 60 seconds.

In other embodiments, the semiconductor process wafer is subjected to at least one of a brushing process and a megasonic agitation process while being contacted with the oxide removal solution to remove the oxide overlayer prior to being subjected to a cleaning process.

Figure 3:
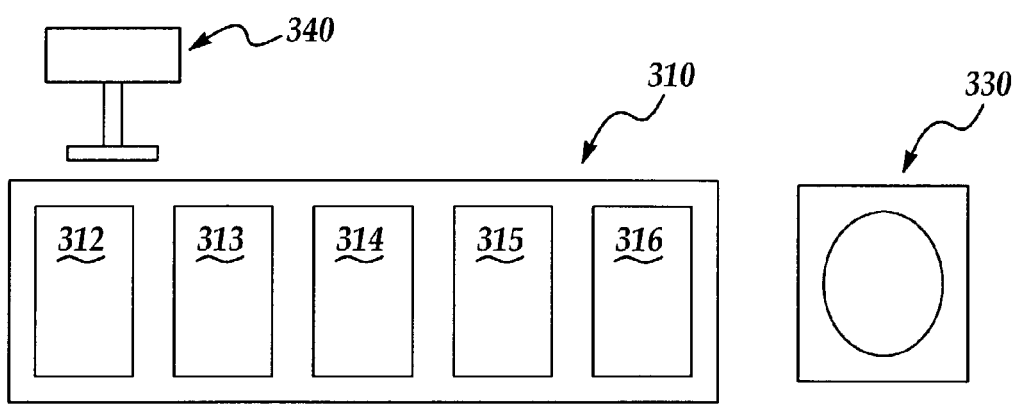
FIG. 3 depicts an operational embodiment of the method according to the present invention.

In exemplary operation, as shown in FIG. 3, the process wafers are loaded into a wet environment 310 and then transported by robotic arm 340 through a series of chambers e.g., 312 through 316 optionally including at least one of dipping, megasonic agitation, and brushing cycles with the oxide removal solution, followed by a rinsing step in a selectable order. The brushing cycle, for example, involves rotating the process wafer at high speed, for example, about 1500 rpm, while a jet of solution is sprayed on the process wafer and the process wafer surface is brushed with a foam brush to dislodge any loose debris. After the brushing cycles, the wafer is deposited in the spin/rinse/dry chamber, e.g., 330 and unloaded dry. In this embodiment, different chambers e.g., 312 through 316 may be equipped with different solutions, for example, the oxide removal solution according to the present invention and conventional rinsing solutions, for example deionized water, for alternatively etching and cleaning the process wafer. Following the oxide removal etching and cleaning processes, the process wafer may proceed to the CMP step for polishing and optionally, to a conventional cleaning step following the CMP step.

Figure 2A:
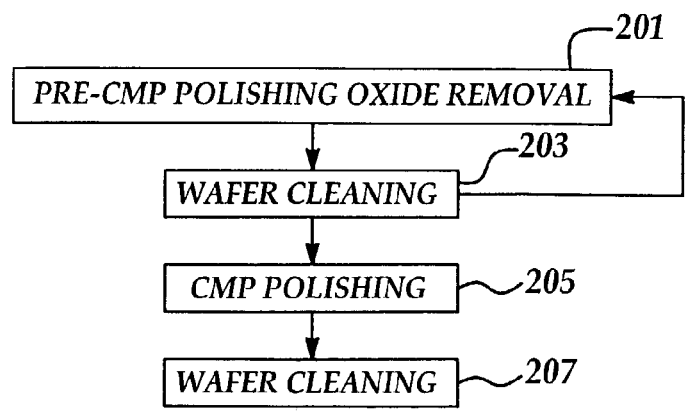
FIGS. 2A to 2C are schematic representations of process flow steps according to different embodiments of the present invention.

For example, referring to FIG. 2A showing a process flow diagram, the substrate, for example, a semiconductor wafer may first be subjected to an pre-CMP polishing oxide removal process 201 optionally including one or more of dipping, brushing and megasonic agitation, using an oxide removal solution according to the present invention followed by a wafer cleaning process 203 using, for example, deionized water to clean the semiconductor wafer, optionally followed by more oxide removal processes including one or more of dipping, brushing and megasonic agitation. After finishing the oxide removal process 201 and the cleaning process 203, the substrate is subjected to a CMP process 205 to polish the underlying metal layer, for example copper, followed by an optional wafer cleaning process 207.

After the oxide removal process according to the present invention, the process wafer is subjected to a CMP process according to the present invention. In one embodiment, the CMP process uses a relatively high hardness abrasive slurry with a Moh hardness value greater than about 5.0 according to a high abrasive process. The slurry, for example, may be a precipitated colloidal metal oxide formed by a sol-gel process or fumed metal oxide formed by a high temperature fuming process, both processes well known in the art. The metal oxide slurry preferably has a solids content of about 1 weight percent to about 20 weight percent, more preferably, about 5 to about 10 weight percent. Further, the metal oxide preferably has a mean particle diameter ranging from about 20 nanometers to about 500 nanometers, more preferably, about 100 to about 300 nanometers. Further, the metal oxide slurry preferably has a particle size distribution with greater than 90 percent of the particles having a particle size of less than about 1 micron. Other precipitated colloidal slurries may be used, for example, slurries having at least one of silica ($SiO_2$), alumina ($Al_2O_3$), ceria ($CeO_2$), titania ($TiO_2$), and zirconia ($ZrO_2$). For example, metal oxides suitable for slurries may be include porous inorganic oxide gels including hydrogels, aerogels, or xerogels formed by conventional processes.

In one embodiment, an oxidizing agent such as hydrogen peroxide ($H_2O_2$) may be used to form an in-situ copper oxide passivation layer to better control material removal rates. Other oxidizing agents may be used including compounds with a peroxy group such as peroxides and percarbonates. Preferably, the oxidizing agent is present in an amount ranging from about 0.3 to about 17.0 weight percent. The CMP slurry preferably having a pH ranging from about 2.0 to about 11 is used according to the present invention. Other oxidizing agents may include, for example, potassium ferricyanide, potassium dichromate, potassium iodate, potassium bromate, vanadium trioxide, hypochlorous acid, sodium hypochlorite, potassium hypochlorite, calcium hypochlorite, magnesium hypochlorite, ferric nitrate, $KMgO_4$, and mixtures thereof.

In another more preferred embodiment, the CMP process is carried out in the absence of an oxidizer but including a complexing agent for chelating copper ions at the target surface, for example a copper containing semiconductor wafer surface. The complexing agent according to the present invention is based on similar criterion for the oxide removal solution. For example, it is believed that under weakly acidic conditions, a complexing agent forms a complex with copper ions at the surface of the copper metal thereby aiding in the removal of copper during the polishing process. Since the ex-situ metal oxide, for example copper oxide has previously been removed by an oxide removal process and a copper oxide passivation layer is not formed in the absence of an oxidizer, a less abrasive material may be used according to this embodiment of the present invention to remove the chelated copper metal. Preferably, the polishing slurry is maintained with a pH of between about 3.0 and about 6.0.

In order to perform the complexing function according to the present invention, the carboxylic acid preferably includes at least one carboxylate group. Exemplary carboxylic acids include formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, adipic acid, and combinations thereof. Preferably, however, a carboxylic acid such as citric acid, which includes two carboxylic acid groups is included in the polishing solution, as it is believed the complexing function is improved thereby. Other acids which are suitable complexing agents include amino acids and amino sulfuric acids, phosphoric acids, phosphoric acids, and their salts. The complexing agent is preferably present in the polishing slurry in an amount ranging from about 0.1 to about 10.0 weight percent. Preferably the polishing solution according to the present invention is within a temperature range of from about 20° C. to about 90° C.

According to the embodiment wherein the CMP process is carried out in the absence of an oxidizer and in the presence of a complexing agent, a low hardness abrasive according to a low abrasive CMP process is preferably used to remove the complexing agent including chelated (complexed) metal ions, for example copper, from the target surface. By the term "low hardness" is meant hardness on a Moh scale of less than about 7.0. For example, low hardness abrasives include one or more of silica ($SiO_2$), ceria ($CeO_2$), titania ($TiO_2$), and zirconia ($ZrO_2$) having a Moh hardness of less than about 7 are suitable for use in this embodiment of the present invention. Suitable slurries may additionally include porous inorganic metal oxide gels such as hydrogels, aerogels, or xerogels formed by conventional processes with a Moh hardness of less than about 7.0.

In another embodiment according to the present invention, the copper oxide layer overlying the copper metal is removed according to a first CMP polishing process by using an oxide removal polishing solution in a first CMP polishing process. Suitable and preferred oxide removal polishing solutions are the same as detailed for the pre-polishing oxide removal process. In this embodiment, the substrate is subjected to a first CMP polishing process while contacted with an oxide removal solution for a period of from about 5 to about 90 seconds, more preferably about 20 about 60 seconds using a conventional CMP polishing apparatus. Following the first CMP polishing process the substrate is subjected to a second CMP polishing process according to either the high abrasive CMP process or the low abrasive CMP process outlined above.

Figure 2B:
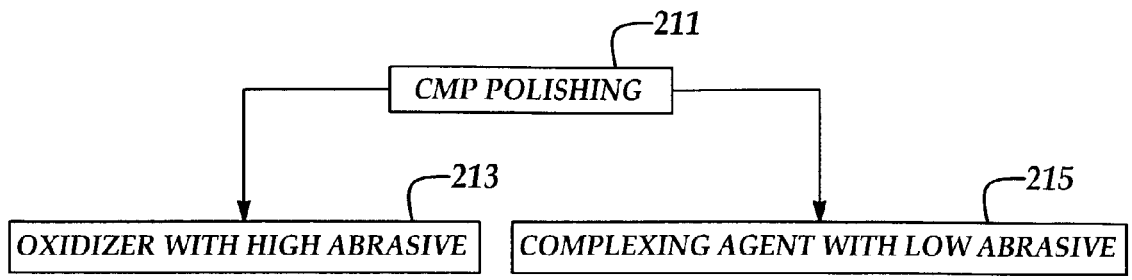

To summarize the various embodiments of the present invention, reference is made to the process flow diagram of FIG. 2B showing the various CMP steps that may occur after following the pre-polishing oxide removal step shown in the process flow diagram in FIG. 2A. According to one embodiment, the CMP step 211 includes an oxidizer and a relatively high hardness abrasive according to process 213, for example, having an Moh hardness greater than about 5.0. According to another embodiment, the CMP process 211 includes a complexing agent in the absence of an oxidizer for forming a surface passivation film according to process 215. In the embodiment according to process 215, a relatively low hardness abrasive is used, for example having a Moh hardness of less than about 7.0. Following each of the CMP procedures a conventional cleaning step is optionally included (not shown).

Figure 2C:
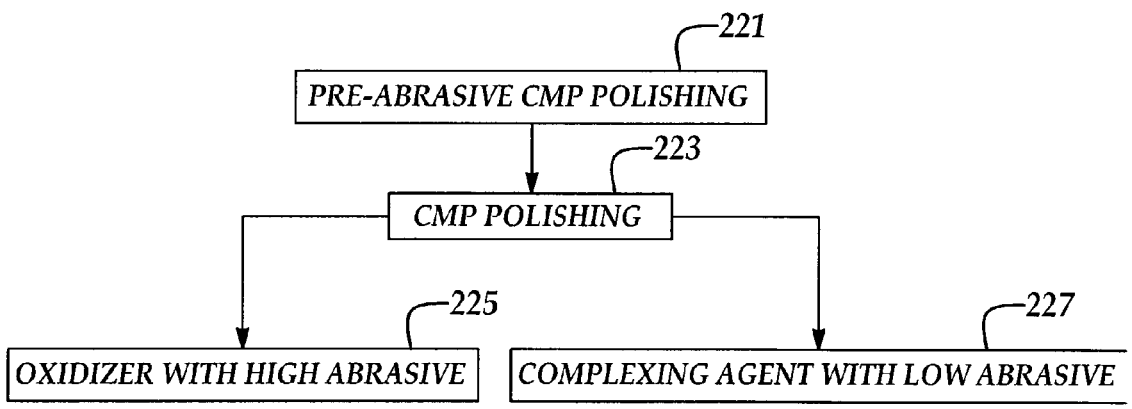

In another embodiment, according to the process flow diagram shown in FIG. 2C, the oxide overlayer is not removed by a pre-polishing process as shown in FIG. 2A but rather the oxide removal process is included in a first CMP polishing step (pre-abrasive polishing step) 221 using conventional CMP polishing apparatus and including the oxide removal solution. In the embodiment according to process 221 abrasives are absent in the CMP polishing solution, the oxide removal being removed according to the chemical action of the oxide removal solution and the CMP polishing pad. Following the pre-abrasive CMP polishing step 221 to remove the oxide overlayer, the substrate, for example a copper containing semiconductor wafer, is subjected to a second CMP process 223 including one of a high abrasive CMP process in the presence of an oxidizer according to process 225 or a low abrasive CMP process in the presence of a complexing agent but in the absence of an oxidizer according to process 227 as previously outlined with respect to the embodiment shown in FIG. 2B.

The CMP process is carried out as a conventional CMP process, for example, in operation, the wafer surface to be polished (target surface) is pressed against the polishing surface of the polishing pad. The down-force between the target surface and the polishing surface of the polishing pad is typically between 5 and 50 psi. The polishing slurry is deposited on the polishing pad, and the target surface and polishing pad are moved with respect to each other to impart relative motion therebetween.

According to the present invention, where the oxide overlayer is removed according to the pre-polishing process, and a low abrasive process then follows, the semiconductor wafer uniformity has shown an improvement in uniformity between about 20 and about 30 percent. Where the oxide overlayer is removed according to a first CMP polishing process followed by a second low abrasive CMP polishing process, wafer uniformity has shown an improvement in uniformity between about 5 and about 10 percent.

Thus, according to the present invention, a method has been presented to both improved polishing uniformity by removing non-uniform oxide overlayers while minimizing polishing induced defects by selectively varying an abrasive hardness in a CMP process.

The preferred embodiments, aspects, and features of the invention having been described, it will be apparent to those skilled in the art that numerous variations, modifications, and substitutions may be made without departing from, the spirit of the invention as disclosed and further claimed below.

What is claimed is:

1. A method for removing a copper oxide overlayer over a copper containing semiconductor process wafer polishing surface prior to a copper chemical mechanical polishing (CMP) process to improve copper polishing uniformity comprising the steps of:

providing a semiconductor process wafer comprising a copper containing polishing surface having said copper oxide overlayer;

removing said copper oxide overlayer according to a process selected from the group consisting of a dipping, megasonic agitation, and brushing, said process comprising a first carboxylic acid containing solution;

carrying out a cleaning step; and, then polishing the copper containing polishing surface to a CMP process comprising an abrasive slurry with a complexing agent in the absence of an oxidizer, said complexing agent comprising a second carboxylic acid.

2. The method of claim 1, wherein the copper containing polishing surface further comprises a dielectric layer.

3. The method of claim 1, wherein the first carboxylic acid comprises more than one carboxylate group.

4. The method of claim 1, wherein the first carboxylic acid is selected from the group consisting of formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

5. The method of claim 1, wherein the pH of the copper oxide removal solution is from about 3.0 to about 5.0.

6. The method of claim 1, wherein the abrasive slurry comprises a low hardness abrasive with a Moh hardness less than about 7.0.

7. The method of claim 6, wherein the abrasive slurry is selected from the group consisting of silica ($SiO_2$), ceria ($CeO_2$), titania ($TiO_2$), and zirconia ($ZrO_2$).

8. The method of claim 1, wherein the complexing agent comprises the second carboxylic acid selected from the group consisting of formic acid, acetic acid, propionic acid, valeric acid, oxalic acid, malonic acid, succinic acid, glutaric acid, maleic acid, fumaric acid, phthalic acid, glycolic acid, lactic acid, citric acid, tartaric acid, gluconic acid, and adipic acid.

9. The method of claim 1, wherein the copper oxide removal solution consists essentially of citric acid.

10. The method of claim 1, wherein the complexing agent consists essentially of citric acid.

11. The method of claim 1, wherein the complexing agent consists essentially of the second carboxylic acid comprising more than one carboxylate group.

12. The method of claim 1, wherein the copper oxide removal solution consists essentially of the first carboxylic acid comprising more than one carboxylate group.

13. The method of claim 1, wherein the step of removing comprises dipping and brushing.

14. The method of claim 1, wherein the step of removing comprises spraying and brushing.

15. The method of claim 1, wherein the step of removing comprises megasonic agitation and brushing.

16. A method for removing an ex-situ formed copper oxide overlayer over a copper containing semiconductor process wafer polishing surface to improve a copper CMP polishing uniformity comprising the steps of:

providing a semiconductor process wafer comprising copper and a copper oxide overlayer;

removing the copper oxide overlayer comprising contacting the copper oxide overlayer with a carboxylic acid containing solution according to a process selected from the group consisting of a dipping process, a megasonic agitation process, and a brushing process; and, then polishing the copper containing semiconductor process wafer polishing surface according to a copper CMP process comprising an abrasive slurry comprising a complexing agent in the absence of an oxidizer, and a low hardness abrasive.

17. The method of claim 16, wherein the low hardness abrasive has a Moh hardness less than about 7.0.

18. The method of claim 16, wherein the complexing agent comprises a second carboxylic acid.

19. The method of claim 16, wherein the complexing agent consists essentially of a second carboxylic acid comprising more than one carboxylate group.

20. The method of claim 16, wherein the complexing agent consists essentially of citric acid.

* * * * *